(12) United States Patent
Neumann et al.

(10) Patent No.: US 10,534,041 B2
(45) Date of Patent: Jan. 14, 2020

(54) MEASURING ARRANGEMENT FOR IDENTIFYING A MALFUNCTION IN AN ENERGY ACCUMULATOR ARRANGEMENT

(71) Applicant: Phoenix Contact GmbH & Co. KG, Blomberg (DE)

(72) Inventors: Daniel Neumann, Nieheim (DE); Eugen Mantler, Steinheim (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 37 days.

(21) Appl. No.: 15/737,702

(22) PCT Filed: Jun. 9, 2016

(86) PCT No.: PCT/EP2016/063203
§ 371 (c)(1),
(2) Date: Dec. 18, 2017

(87) PCT Pub. No.: WO2016/206987
PCT Pub. Date: Dec. 29, 2016

(65) Prior Publication Data
US 2018/0156871 A1    Jun. 7, 2018

(30) Foreign Application Priority Data
Jun. 24, 2015  (DE) .......................... 10 2015 110 183

(51) Int. Cl.
*G01R 19/14* (2006.01)
*G01R 31/36* (2019.01)
(Continued)

(52) U.S. Cl.
CPC ......... *G01R 31/396* (2019.01); *G01R 31/382* (2019.01); *G01R 31/389* (2019.01); *G01R 31/392* (2019.01)

(58) Field of Classification Search
CPC .. G01R 31/396; G01R 31/389; G01R 31/392; G01R 31/382
See application file for complete search history.

(56) References Cited

U.S. PATENT DOCUMENTS

2010/0213897 A1    8/2010 Tse
2011/0019321 A1*   1/2011 Chen .................... G01R 31/024
                                              361/87
(Continued)

FOREIGN PATENT DOCUMENTS

CN    103954917 A    7/2014
CN    104379391 A    2/2015
(Continued)

*Primary Examiner* — David M. Gray
*Assistant Examiner* — Michael A Harrison
(74) *Attorney, Agent, or Firm* — Holland & Hart LLP

(57) ABSTRACT

The present disclosure relates to a measuring arrangement for identifying a malfunction in an energy accumulator arrangement, including a measuring device configured to measure an electrical measurement variable of the first energy accumulator and an electrical measurement variable of the further energy accumulator: a circuit arrangement having a first controllable switch configured to electrically connect the first energy accumulator to the measuring device and a further controllable switch for electrically connecting the further energy accumulator to the measuring device; and a processor device for controlling the controllable switches to capture the electrical measurement variable of the further energy accumulator.

18 Claims, 5 Drawing Sheets

(51) Int. Cl.
  *G01R 31/396*  (2019.01)
  *G01R 31/382*  (2019.01)
  *G01R 31/389*  (2019.01)
  *G01R 31/392*  (2019.01)

(56) References Cited

U.S. PATENT DOCUMENTS

| | | |
|---|---|---|
| 2012/0182021 A1 | 7/2012 | McCoy et al. |
| 2013/0300370 A1 | 11/2013 | Hotta |
| 2015/0153415 A1* | 6/2015 | Fink .................. B60L 58/16 |
| | | 324/430 |

FOREIGN PATENT DOCUMENTS

| | | |
|---|---|---|
| DE | 602 02 485 T2 | 12/2005 |
| DE | 11 2007 002 569 T5 | 8/2009 |
| DE | 11 2011 101 823 T5 | 3/2013 |
| EP | 0 982 830 A2 | 3/2000 |
| EP | 1 203 964 A2 | 5/2002 |
| WO | WO 2012/099866 A2 | 7/2012 |
| WO | WO 2013/182440 A2 | 12/2013 |

* cited by examiner

MEASURING ARRANGEMENT FOR IDENTIFYING A MALFUNCTION IN AN ENERGY ACCUMULATOR ARRANGEMENT

CROSS-REFERENCE TO RELATED APPLICATIONS

This application is a 371 national phase filing of International Application No. PCT/EP2016/063203, entitled "MEASURING ARRANGEMENT FOR IDENTIFYING A MALFUNCTION IN AN ENERGY ACCUMULATOR ARRANGEMENT", filed 9 Jun. 2016, which claims priority to German Patent Application No. 10 2015 110 183.1, entitled "MESSANORDNUNG ZUM ERKENNEN EINER FEHLFUNKTION IN EINER ENERGIESPEICHERANORDNUNG", filed 24 Jun. 2015.

BACKGROUND

The present disclosure relates to a measuring arrangement for monitoring energy accumulators in an energy accumulator arrangement and for identifying defective energy accumulators in the energy accumulator arrangement.

Energy accumulator arrangements which consist of a plurality of electrically connected energy accumulators are used in uninterruptible power supplies (UPS), for example. The task of a UPS is to protect electrical installations which are connected to a power supply system from disruptions in the power supply system. If the mains current fails or fluctuates, the energy accumulators of the UPS may assume the power supply for the electrical installation within a few milliseconds. The energy accumulators of the UPS are often accumulators, for example lithium polymer accumulators. These energy accumulators are usually connected in parallel in order to form a common energy accumulator with a high charging capacity.

During the service life of a UPS, the energy accumulators are exposed to an ageing process, for example on account of the loading caused by regular charging and discharging operations or on account of temperature fluctuations. This may result in premature defects of individual energy accumulators in the energy accumulator arrangement. Detects in individual energy accumulators may reduce the reliability of the UPS system and, in the extreme case, may result in complete failure of the UPS system. The usually parallel connection makes it difficult to evaluate the individual energy accumulators, with the result that an individual defective energy accumulator in the energy accumulator arrangement is difficult to identify.

SUMMARY

The object on which the disclosure is based is to provide a measuring arrangement for monitoring energy accumulators in an energy accumulator arrangement and for identifying defective energy accumulators in the energy accumulator arrangement.

This object is achieved by means of subjects having the features according to the independent claims. The figures, the description and the dependent claims relate to advantageous example of the disclosure.

According to a first aspect of the disclosure, the object is achieved by means of a measuring arrangement for identifying a malfunction in an energy accumulator arrangement having a first energy accumulator and having at least one further energy accumulator, comprising: a measuring device which is configured to measure an electrical measurement variable of the first energy accumulator and an electrical measurement variable of the further energy accumulator of the plurality of energy accumulators; a circuit arrangement having a first controllable switch for electrically connecting the first energy accumulator to the measuring device and having a further controllable switch for electrically connecting the further energy accumulator to the measuring device; a processor device for controlling the controllable switches of the circuit arrangement, the processor device being configured to keep the first switch closed and to open the further switch in order to disconnect the further energy accumulator from the measuring device for the purpose of capturing the electrical measurement variable of the first energy accumulator and to keep the further switch closed and to open the first switch in order to disconnect the first energy accumulator from the measuring device for the purpose of capturing the electrical measurement variable of the further energy accumulator. This achieves the advantage that the measuring arrangement can be used to capture the electrical measurement variable of each energy accumulator in the energy accumulator arrangement efficiently and in a manner which is not influenced by the other energy accumulators in the energy accumulator arrangement.

The measuring arrangement may be in the form of a closed module which comprises a housing, for example, in which all components of the measuring arrangement are arranged. This module may provide electrical terminals for an external energy accumulator arrangement. Furthermore, the measuring arrangement, together with the energy accumulator arrangement, can form a closed component part in which, for example, the components of the measuring arrangement and the energy accumulators are arranged in a common housing.

The energy accumulators may be rechargeable batteries, for example lithium ion accumulators, lithium polymer accumulators or lead accumulators, which may have an accumulator voltage of 12 or 24 V, for example. In this case, the energy accumulators which are electrically connected to one another in the energy accumulator arrangement may be of the same type and may have an identical voltage and an identical acid density.

The controllable switches of the circuit arrangement may be transistor switches, in particular MOSFET switches. In particular, each controllable switch may consist of an electrical circuit comprising two MOSFET switches which are connected, in series and the source terminals of which are electrically connected. In addition, a Zener diode can be connected between the source and gate terminals of the MOSFET switches for the purpose of limiting the voltage.

The processor device may be a microcontroller, the microcontroller being able to comprise a processor and/or a memory. The processor device may be electrically connected to the measuring device for the purpose of receiving the measured electrical measurement variables. The processor device may also be configured in such a manner that it calculates parameter values from the received electrical measurement variables. If the controllable switches are transistor switches, the processor device may be electrically connected to the gate electrodes of the transistor switches for the purpose of controlling the controllable switches and may electrically control them by applying a gate voltage, in order to provide a sufficiently high gate voltage when controlling the gate electrodes of the transistor switches, DC-DC converters, for example boost converters or charge pumps, may be connected between the processor device and the gate electrodes of the transistor switches.

In one advantageous example of the measuring arrangement, the circuit arrangement has a plurality of controllable switches, each controllable switch being configured to electrically connect an energy accumulator of the plurality of energy accumulators to the measuring device, and the processor device being configured to close only the first controllable switch or to keep it closed and to open all other controllable switches or to allow them to be opened for the purpose of capturing the electrical measurement variable of the first energy accumulator. This achieves the advantage that the electrical measurement variable of the first energy accumulator cannot be influenced by the electrical properties of a further energy accumulator in the energy accumulator arrangement while it is being captured.

In another advantageous example of the measuring arrangement, the circuit arrangement is configured to connect the first energy accumulator and the further energy accumulator in parallel during operation of the energy accumulators. This achieves the advantage that a common energy accumulator with an increased charging capacity and an increased service life can be provided in an efficient manner.

In another advantageous example, the measuring arrangement can be operated in a test mode and in an operating mode, the electrical measurement variable of the first energy accumulator and the electrical measurement variable of the further energy accumulator being captured in the test mode, and the circuit arrangement in the operating mode being configured to connect the first energy accumulator and the further energy accumulator in parallel. This achieves the advantage that the energy accumulators can be efficiently tested for their functionality in a temporally restricted test mode, while the measuring arrangement in the operating mode can ensure an optimum operating state of the energy accumulator arrangement.

In another advantageous example of the measuring arrangement, the measuring device is configured to capture the electrical measurement variable of the first energy accumulator and the electrical measurement variable of the further energy accumulator in temporally successive measurement intervals, precisely only one switch of the circuit arrangement being closed and all other switches of the circuit arrangement being open within a measurement interval. This achieves the advantage that an electrical measurement variable of an energy accumulator can be measured efficiently and in a manner which is not influenced by the other energy accumulators in the energy accumulator arrangement.

In another advantageous example of the measuring arrangement, the processor device is configured to keep only the first switch closed and to open the further switch within a first measurement interval and to keep only the further switch closed and to open the first switch within a further measurement interval. This achieves the advantage that the electrical measurement variable of each energy accumulator in the energy accumulator arrangement can be captured in a manner which is not influenced by the other energy accumulators in the energy accumulator arrangement.

In another advantageous example of the measuring arrangement, the measuring device has a first measuring unit which is connected to the first controllable switch and is intended to measure the electrical measurement variable of the first energy accumulator, in particular an internal resistance, a voltage or a current, and the measuring device has a further measuring unit which is connected to the further controllable switch and is intended to measure the electrical measurement variable of the further energy accumulator, in particular an internal resistance, a voltage or a current, and/or the measuring device has a common measuring unit which is connected to the first controllable switch and to the further controllable switch and is intended to measure a common electrical measurement variable, in particular an internal resistance, a voltage or a current, of the first energy accumulator and of the further energy accumulator. This achieves the advantage that the electrical measurement variables of each individual energy accumulator and a common electrical measurement variable of all energy accumulators can be efficiently captured.

In another advantageous example of the measuring arrangement, the measuring device additionally has an environment measuring unit for measuring an environmental parameter, in particular a temperature. This achieves the advantage that the environmental parameter can be taken into account by the measuring arrangement when monitoring the energy accumulators and when identifying defective energy accumulators. If the environmental parameter is a temperature, conclusions with regard to the ageing process of the energy accumulators, for example, can be drawn from measurements of the temperature profile.

In another advantageous example of the measuring arrangement, the processor device is configured to evaluate the measured electrical measurement variables, in particular to compare them with electrical reference variables, in order to detect a malfunction of the first energy accumulator or of the further energy accumulator. This achieves the advantage that individual defective energy accumulators in the energy accumulator arrangement can be efficiently identified.

In another advantageous example of the measuring arrangement, the processor device is configured to determine the instantaneous charging capacity of the first energy accumulator and the instantaneous charging capacity of the further energy accumulator from the first electrical measurement variable of the first energy accumulator, in particular from a charging current of the first energy accumulator, and from the electrical measurement variable of the further energy accumulator, in particular from a charging current of the further energy accumulator, a malfunction of the first energy accumulator being determined if the charging capacity of the first energy accumulator corresponds to a reference value of the rated charge of the first energy accumulator and the charging current of the first energy accumulator is greater than a reference value of the trickle charging current of the first energy accumulator, and a malfunction of the further energy accumulator being determined if the instantaneous charging capacity of the further energy accumulator corresponds to a reference value of the rated charge of the further energy accumulator and the charging current of the further energy accumulator is greater than a reference value of the trickle charging current of the further energy accumulator. This achieves the advantage that defective energy accumulators in the energy accumulator arrangement can be efficiently identified during charging operation of the energy accumulator arrangement.

In another advantageous example of the measuring arrangement, the processor device is configured to permanently open the first controllable switch if a malfunction of the first energy accumulator is detected in order to disconnect the first energy accumulator or to permanently open the further controllable switch if a malfunction of the further energy accumulator is detected in order to disconnect the further energy accumulator. This achieves the advantage that a negative influence of the energy accumulator arrangement as a result of a defective energy accumulator can be prevented.

In another advantageous example of the measuring arrangement, the circuit arrangement is configured to connect the first electrical energy accumulator and the further electrical energy accumulator in parallel, and the measuring device is configured to capture a polarity of the electrical measurement variable of the first energy accumulator and a polarity of a further electrical measurement variable in the energy accumulator arrangement, the processor device being configured to identify the malfunction of the energy accumulator arrangement by comparing the polarity of the electrical measurement variable of the first energy accumulator and the polarity of the further electrical measurement variable. This achieves the advantage that a malfunction of an energy accumulator in the energy accumulator arrangement can be detected during ongoing operation and without restricting the use of the energy accumulator arrangement.

In another advantageous example of the measuring arrangement, the processor device is configured to identify the malfunction of an energy accumulator in the energy accumulator arrangement if the polarity of the electrical measurement variable of the first energy accumulator and the polarity of the further electrical measurement variable are different. This achieves the advantage that it is possible to efficiently identify a defective energy accumulator.

In another advantageous example of the measuring arrangement, the measuring device is configured to capture the polarity of the electrical measurement variable of the first energy accumulator and the polarity of the further electrical measurement variable by capturing an electrical direction of the electrical measurement variable of the first energy accumulator and of the further electrical measurement variable. This achieves the advantage that it is possible to efficiently capture the polarities of the measured electrical measurement variables.

In another advantageous example of the measuring arrangement, the further electrical measurement variable is an electrical measurement variable of the further energy accumulator, or the further electrical measurement variable is an electrical measurement variable at a connection point of the first energy accumulator and of the further energy accumulator. This achieves the advantage that the polarity of the electrical measurement variables of individual energy accumulators in the energy accumulator arrangement and the polarity of common electrical measurement variables of a plurality of energy accumulators in the energy accumulator arrangement can be used to identify a defective energy accumulator.

In another advantageous example of the measuring arrangement, the first measuring unit is configured to capture the polarity of the electrical measurement variable of the first energy accumulator, and a further measuring unit is configured to capture the polarity of the further electrical measurement variable. This achieves the advantage that the polarity of the electrical measurement variable of each energy accumulator in the energy accumulator arrangement can be efficiently captured.

In another advantageous example of the measuring arrangement, the measuring device has a common measuring unit for capturing the polarity of the electrical measurement variable at the connection point of the first energy accumulator and of the further energy accumulator in order to obtain a common polarity, and the processor device is configured to identify the malfunction of the energy accumulator arrangement by comparing the polarity of the electrical measurement variable of the first energy accumulator or the polarity of the further electrical measurement variable with the common polarity. This achieves the advantage that it is possible to efficiently identify the defective energy accumulators in the energy accumulator arrangement.

In another advantageous example of the measuring arrangement, the measuring arrangement outputs an acoustic or optical warning signal if a defective energy accumulator is identified. This achieves the advantage that a user can be warned if there is a defective energy accumulator in the energy accumulator arrangement. The acoustic warning signal may be a continuous or periodic warning tone. The optical warning signal may be continuous or periodic fight emission by a light-emitting element in a signal color.

In another advantageous example of the measuring arrangement, the measuring arrangement comprises the first energy accumulator and the further energy accumulator. This achieves the advantage that it is possible to provide an extended energy accumulator arrangement which can monitor the energy accumulators integrated in it and can identify defective energy accumulators.

In another advantageous example of the measuring arrangement, the measuring arrangement has a connection terminal for connecting the circuit arrangement to an auxiliary energy supply apparatus, in particular an uninterruptible voltage supply, in order to provide the electrical energy accumulators for the auxiliary energy supply. This achieves the advantage that it is possible to provide an auxiliary energy supply apparatus having a high degree of reliability.

In another advantageous example of the measuring arrangement, the auxiliary energy supply apparatus comprises a charging function and/or an external charger for electrically charging the energy accumulators.

In another advantageous example of the measuring arrangement, the measuring arrangement has a communication interface, in particular a LIN bus interface, for outputting electrical measurement variables and/or parameters or for receiving parameters and/or control commands. This achieves the advantage that efficient communication can take place between the measuring arrangement and an apparatus connected to the measuring arrangement. The apparatus may be an auxiliary energy supply apparatus, for example.

The communication interface may be connected to a communication line in the measuring device. Furthermore, the processor device and/or the measuring units of the measuring device and/or the energy accumulators in the energy accumulator arrangement may be connected to the communication line. In this manner, the measurement variables captured by the processor device can be transmitted to the apparatus connected to the communication interface via the communication line or control commands, for example commands for opening or closing the controllable switches, can be transmitted from the apparatus connected to the communication interface to the processor device. In addition, operating parameters of the energy accumulators can be transmitted to the processor device or to the apparatus connected to the communication interface via the communication line.

According to a second aspect of the disclosure, the object is achieved by means of an auxiliary energy supply apparatus for providing electrical energy in a manner independent of the mains, the measuring arrangement according to the disclosure being integrated in the auxiliary energy supply apparatus. This achieves the advantage that it is possible to provide an auxiliary energy supply apparatus having a high degree of reliability which can be used without externally connected energy accumulators.

BRIEF DESCRIPTION OF THE DRAWINGS

Exemplary of the disclosure are illustrated in the drawings and are described in more detail below.

In the drawings.

DETAILED DESCRIPTION

Figure 1:
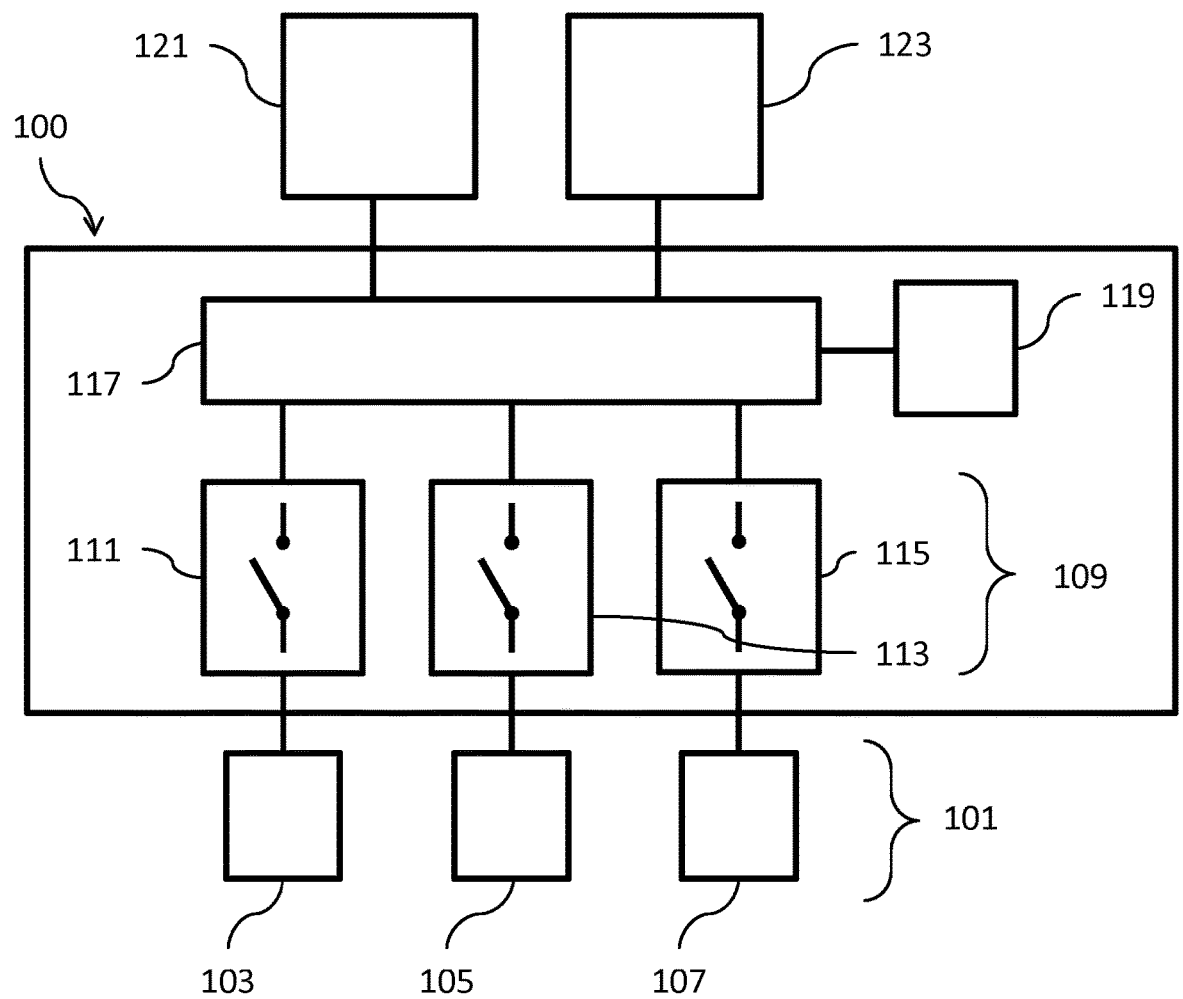
FIG. 1 shows a schematic illustration of a measuring arrangement.

FIG. 1 shows a schematic illustration of a measuring arrangement 100. The measuring arrangement 100 has a measuring device 117, a circuit arrangement 109 and a processor device 119, an energy accumulator arrangement 101, an auxiliary energy supply apparatus 121 and an external charger 123 being connected to the measuring arrangement 100. The circuit arrangement 109 comprises a first controllable switch 111 and two further controllable switches 113, 115, to which a first energy accumulator 103 and two further energy accumulators 105, 107 are connected.

The measuring arrangement 100 for identifying a malfunction in the energy accumulator arrangement 101 having the first energy accumulator 103 and having at least one further energy accumulator 105, 107 comprises the measuring device 117 which is configured to measure an electrical measurement variable of the first energy accumulator 103 and an electrical measurement variable of the further energy accumulator 105, 107 of the plurality of energy accumulators, the circuit arrangement 109 having a first controllable switch 111 for electrically connecting the first energy accumulator 103 to the measuring device 117 and having a further controllable switch 113, 115 for electrically connecting the further energy accumulator 105, 107 to the measuring device, and the processor device 119 for controlling the controllable switches of the circuit arrangement 109. The processor device 119 is configured to keep the first switch 111 closed and to open the further switch 113, 115 in order to disconnect the further energy accumulator 105, 107 from the measuring device 117 for the purpose of capturing the electrical measurement variable of the first energy accumulator 103 and to keep the further switch 113, 115 closed and to open the first switch 111 in order to disconnect the first energy accumulator 103 from the measuring device 117 for the purpose of capturing the electrical measurement variable of the further energy accumulator 105, 107. This makes it possible to capture the electrical measurement variable of each energy accumulator in an energy accumulator arrangement 101 efficiently and in a manner which is not influenced by other energy accumulators in the energy accumulator arrangement 101.

The measuring arrangement 100 may be in the form of a closed module which comprises a housing, for example, in which all components of the measuring arrangement 100 are arranged. This module may provide electrical terminals for an external energy accumulator arrangement 101. Furthermore, the measuring arrangement 100, together with the energy accumulator arrangement 101, can form a closed component part in which, for example, the components of the measuring arrangement 100 and the energy accumulator arrangement 101 are arranged in a common housing.

The energy accumulators may be rechargeable batteries, for example lithium ion accumulators, lithium polymer accumulators or lead accumulators, which may have an accumulator voltage of 12 or 24 V, for example. In this case, the energy accumulators which are electrically connected to one another in the energy accumulator arrangement 101 may be of the same type and may have an identical voltage and an identical acid density.

The controllable switches of the circuit arrangement 109 may be transistor switches, in particular MOSFET switches. In particular, each controllable switch may consist of an electrical circuit comprising two MOSFET switches which are connected in series and the source terminals of which are electrically connected. In addition, a Zener diode can be connected between the source and gate terminals of the MOSFET switches for the purpose of limiting the voltage.

The processor device 119 may be a microcontroller, the microcontroller being able to comprise a processor and/or a memory. The processor device 119 may be electrically connected to the measuring device 117 for the purpose of receiving the measured electrical measurement variables. The processor device 119 may also be configured in such a manner that it calculates parameter values from the received electrical measurement variables. If the controllable switches are transistor switches, the processor device 119 may be electrically connected to the gate electrodes of the transistor switches for the purpose of controlling the controllable switches and may electrically control them by applying a gate voltage. In order to provide a sufficiently high gate voltage when controlling the gate electrodes of the transistor switches, DC-DC converters, for example boost converters or charge pumps, may be connected between the processor device 119 and the gate electrodes of the transistor switches.

Figure 2:
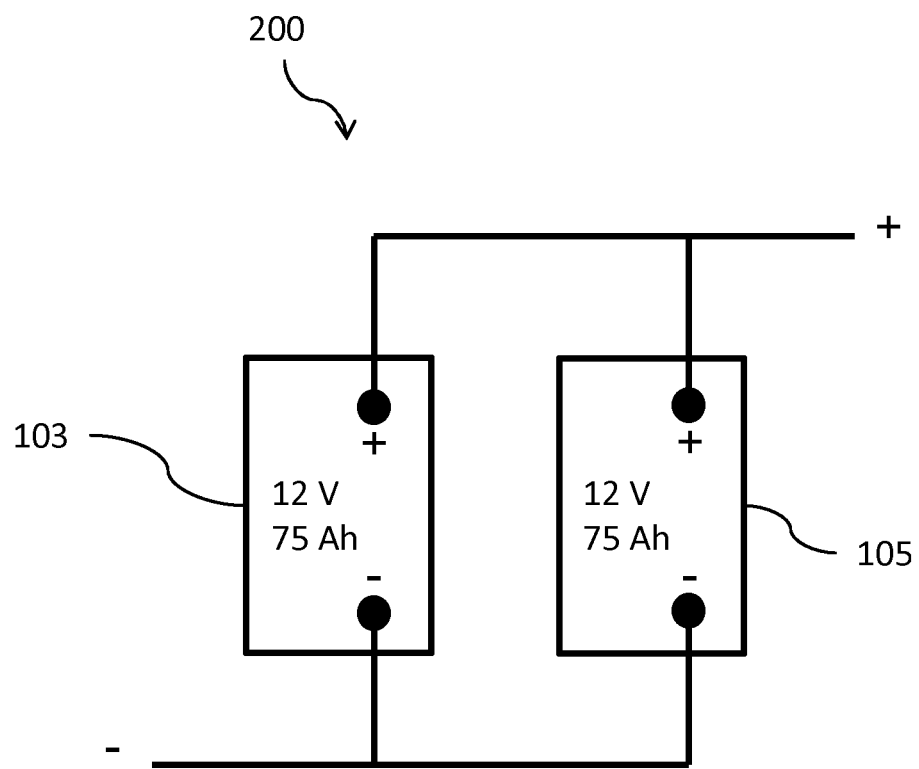
FIG. 2 shows a schematic illustration of a parallel circuit comprising two energy accumulators.

FIG. 2 shows a schematic illustration of a parallel circuit 200 comprising a first energy accumulator 103 and a further energy accumulator 105.

The parallel circuit 200 comprising the first energy accumulator 103 and the further energy accumulator 105 can be formed by electrically connecting the positive poles of the energy accumulators and the negative poles of the energy accumulators to one another. According to another example, the energy accumulators connected in this manner may be energy accumulators of the same type, for example accumulators with the same voltage and the same acid density.

In FIG. 2, the first energy accumulator 103 and the further energy accumulator 105, for example, each have a voltage of 12 V and a charging capacity of 75 Ah. As a result of the parallel circuit 200, the charging capacity of the first energy accumulator 103 and the charging capacity of the further energy accumulator 105 are added, while the voltage of the parallel circuit 200 corresponds to the voltage of the individual energy accumulators. The resulting parallel circuit 200 comprising the energy accumulators in FIG. 2 has a voltage of 12 V and a charging capacity of 150 Ah. This makes it possible to provide a parallel circuit 200 comprising any desired number of individual energy accumulators each with the same voltage, the resulting voltage of the parallel circuit 200 corresponding to the voltages of the individual energy accumulators and the charging capacity of the parallel circuit 200 corresponding to the sum of the charging capacities of the individual energy accumulators. According to another example, the first energy accumulator 103 and the further energy accumulator 105 may be lithium ion accumulators, lithium polymer accumulators or lead accumulators.

Figure 3:
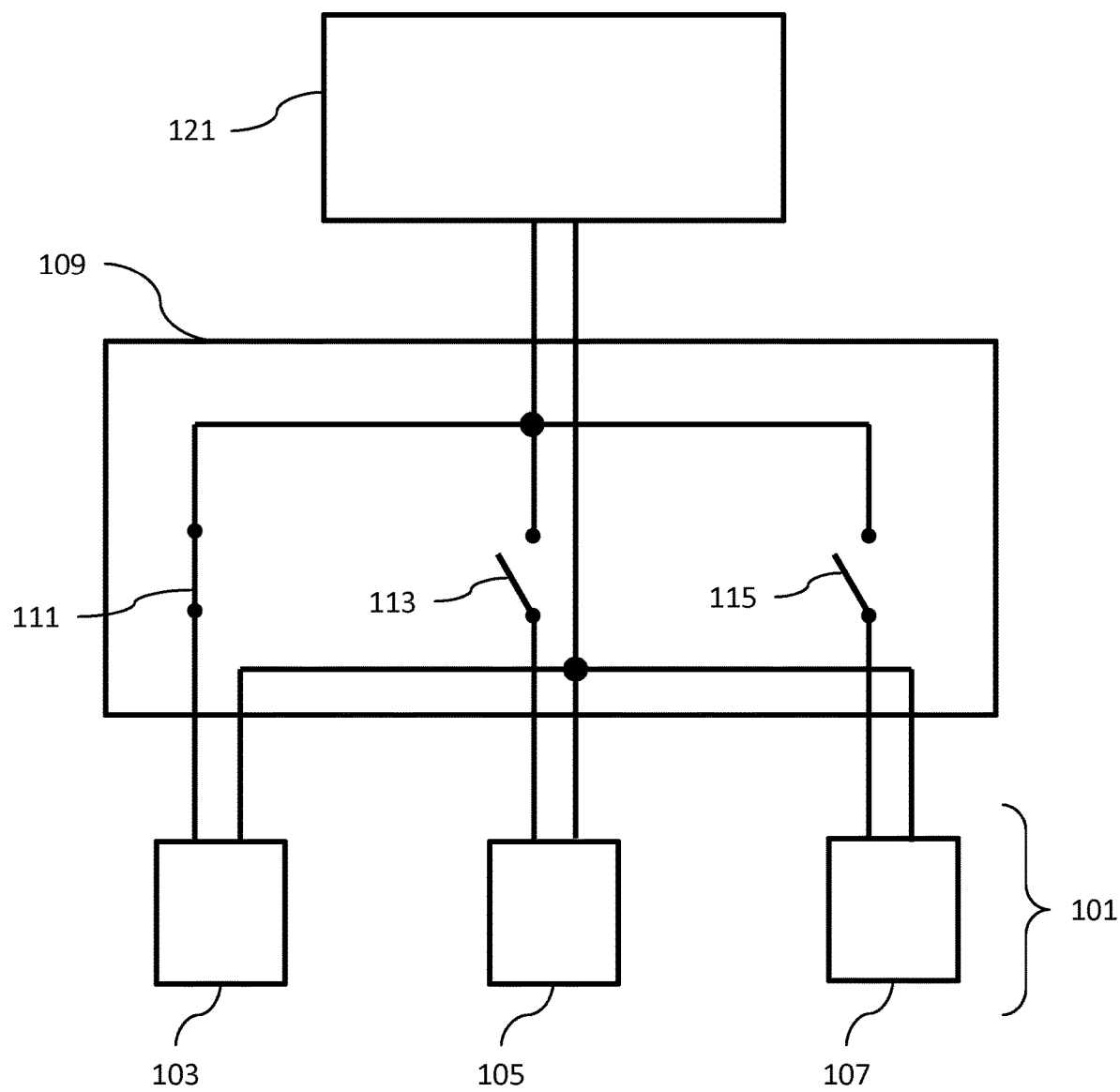
FIG. 3 shows a schematic illustration of a circuit arrangement.

FIG. 3 shows a schematic illustration of a circuit arrangement 109 consisting of a first controllable switch 111 and two further controllable switches 113, 115, to which an energy accumulator arrangement 101 consisting of a first energy accumulator 103 and two further energy accumulators 105, 107 is connected. An auxiliary energy supply apparatus 121 is also connected to the circuit arrangement 109.

The first controllable switch 111 or the further controllable switches 113, 115 of the circuit arrangement 109 may be opened in order to interrupt the connection of the first energy accumulator 103 or of the further energy accumulators 105, 107 to the auxiliary energy supply apparatus 121 anchor to the measuring device 117. In FIG. 3, the first controllable switch 111 is closed and the further controllable switches 113, 115 are open. The measuring device 117 and the processor device 119 are not depicted in FIG. 3.

According to another example, a possibility of disconnecting defective energy accumulators in the energy accumulator arrangement 101 may be provided by means of the controllable switches. If a defective energy accumulator is determined, the controllable switch connected to the defective energy accumulator can be permanently opened and the connection of the defective energy accumulator to the auxiliary energy supply apparatus 121 and/or to the measuring device 117 and/or to the remaining energy accumulators in the energy accumulator arrangement 101 can therefore be permanently interrupted. Disconnecting a defective energy accumulator makes it possible to avoid a negative influence of the remaining energy accumulators, for example a discharge of the remaining energy accumulators as a result of the defective energy accumulator.

According to another example, the individual energy accumulators 103, 105, 107 in the energy accumulator arrangement 101 can be cyclically checked. This cyclical check can be carried out in temporally successive measurement intervals, a controllable switch which is connected to an energy accumulator to be checked being closed and all other controllable switches of the circuit arrangement 109 being opened in each measurement interval. The electrical measurement variable of the energy accumulator to be checked can therefore be effected in a manner which is not influenced by the remaining energy accumulators in the energy accumulator arrangement 101 in the measurement interval. FIG. 3 shows, for example, the position of the switches in a measurement interval in which the first energy accumulator 103 is checked and only the first controllable switch 101 is closed and the further controllable switches 113, 115 are open for this purpose. According to another example, the energy accumulators can be cyclically checked in this manner in temporally successive measurement intervals in a test mode of the measuring arrangement 100 which differs from the operating mode in which all controllable switches are closed.

Figure 4:
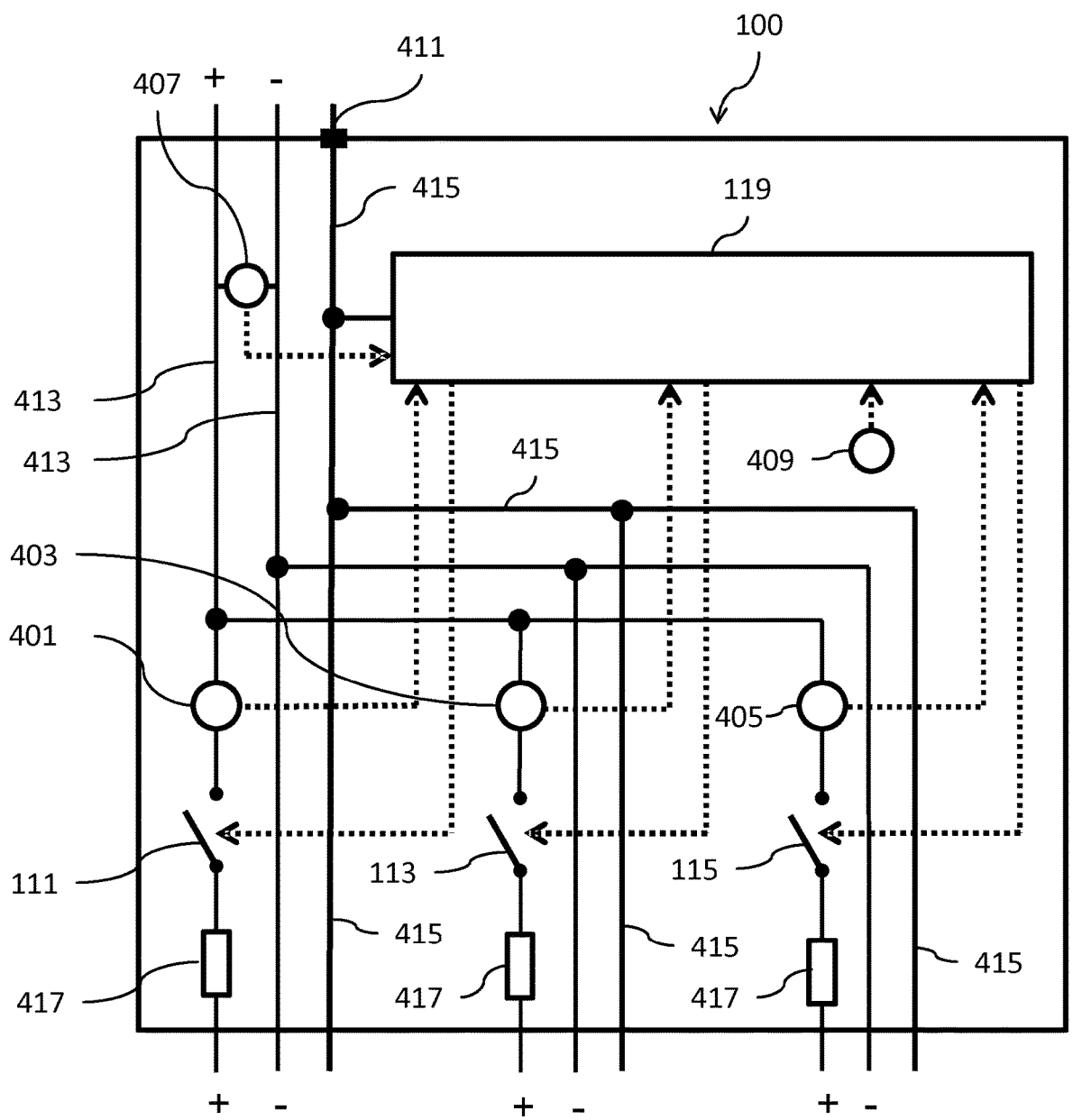
FIG. 4 shows a schematic illustration of a measuring arrangement.

FIG. 4 shows a schematic illustration of a measuring arrangement 100, individual measuring units of the measuring device 117 being illustrated. The measuring units are a first measuring unit 401 which is connected to the first controllable switch 111, two further measuring units 403, 405 which are each connected to a further controllable switch 113, 115, and a common measuring unit 407 and an environment measuring unit 409. The measuring arrangement 100 also has an electrical line arrangement 413 which connects the energy accumulators in parallel in the measuring arrangement 100, and a communication line 415 which is connected to the energy accumulators, the processor device 119 and a communication interface 411.

The first measuring unit 401 and the further measuring units 403, 405 may capture an electrical measurement variable of the first energy accumulator 103 or an electrical measurement variable of the further energy accumulators 105, 107. These electrical measurement variables may be au internal resistance, a voltage or a current. According to one example, the electrical measurement variables may be charging or discharging currents of the first energy accumulator 103 and of the further energy accumulators 105, 107, the current direction indicating the polarity of the electrical measurement variables. The common measuring unit 407 can capture a common electrical measurement variable of the first and further energy accumulators. The common electrical measurement variable may likewise be an internal resistance, a voltage or a current. The common electrical measurement variable may also be a common charging or discharging current of the first energy accumulator 103 and of the farther energy accumulators 105, 107, the current direction indicating the common polarity of the common electrical measurement variable.

According to another example, the first measuring unit 401, the further measuring units 403, 405 and the common measuring unit 407 are electrically connected to the processor device 119. The electrical measurement variables determined in the measuring units can therefore be transmitted to the processor device 119 and can be evaluated in the processor device 119. This evaluation may consist of a comparison of the electrical measurement variables with one another or a comparison of the electrical measurement variables with electrical reference variables. According to another example, the environment measuring unit 409 is a temperature measuring unit which is likewise electrically connected to the processor device 119. The measured temperature values can be evaluated in the processor device 119. For example, a defective energy accumulator can be inferred from a severe rise in the temperature.

According to another example, a communication line 415 is connected to the communication interface 411. This communication line 415 connects the communication interface 411 to the processor device 119 and/or to the energy accumulators in the energy accumulator arrangement 101. If an apparatus, for example an auxiliary energy supply apparatus 121, is also connected to the communication interface 411, parameter values and measurement variables can be transmitted from the processor device 119 or the energy accumulators 103, 105, 107 to the connected apparatus, or commands, for example control commands for opening or closing the controllable switches, can be transmitted from the connected apparatus to the processor device 119.

According to another example, the communication interface 411 is a LIN bus interface and communication takes place via the communication line 415 according to a LIN bus standard. In this LIN bus system, the auxiliary energy supply apparatus 121 may be set up as a master and the processor device 119 and the energy accumulators may be set up as slaves. In order to communicate via the LIN bus, a unique communication address can be assigned to each component connected to the communication line 415.

According to another example, the controllable switches 111, 113, 115 of the circuit arrangement 109 are electrically connected to the energy accumulators 103, 105, 107 in the energy accumulator arrangement 101 via electrical resistors 417. These electrical resistors 417 can be used when measuring the internal resistance or the charging or discharging currents of the energy accumulators 103, 105, 107.

Figure 5:
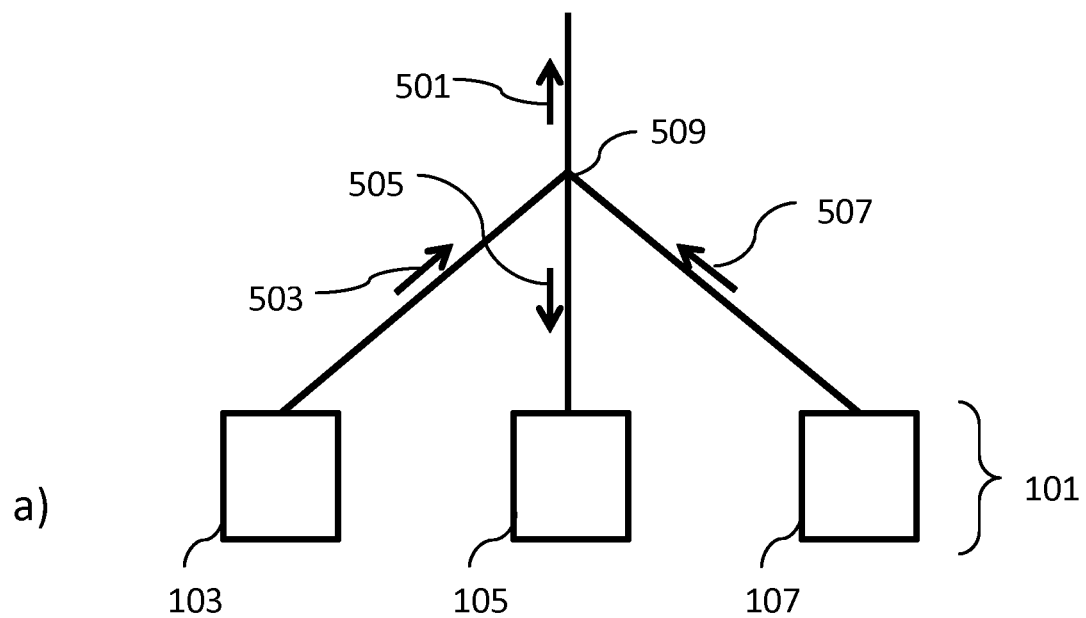
FIG. 5a shows a schematic illustration of the polarities of the electrical measurement variables of a plurality of energy accumulators.
FIG. 5b shows a schematic illustration of the polarities of the electrical measurement variables of a plurality of energy accumulators.
Figure 5:
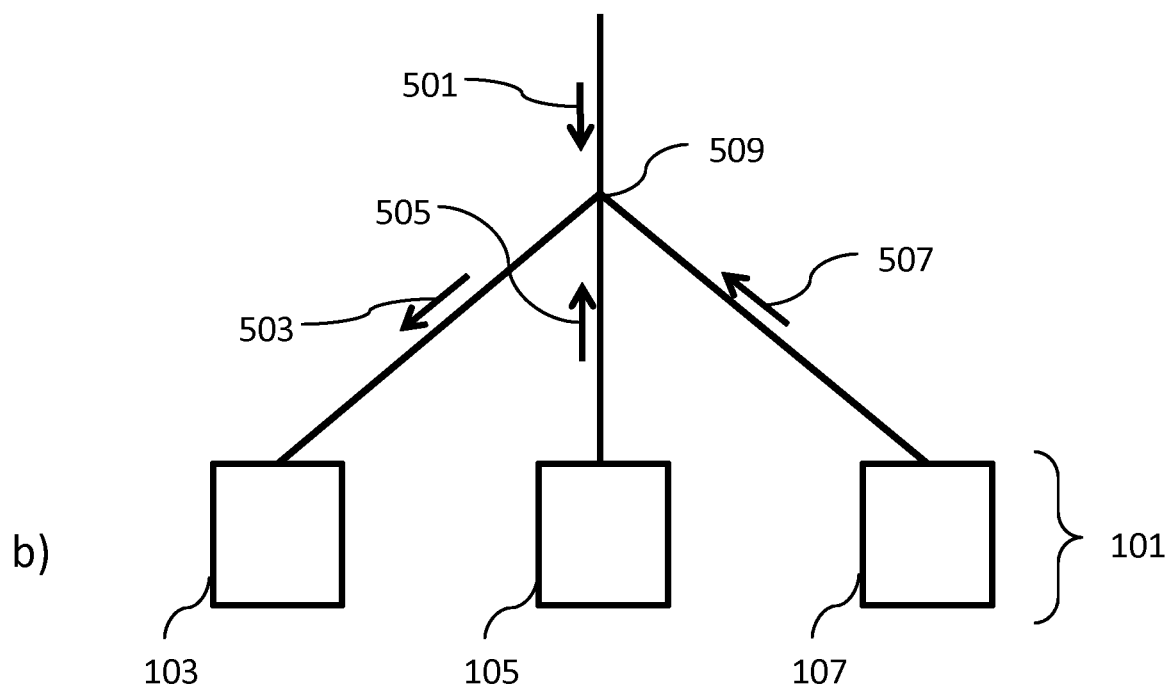

FIG. 5a and FIG. 5b show schematic illustrations of the polarities of electrical measurement variables in an energy accumulator arrangement 101 consisting of a first energy accumulator 103 and two further energy accumulators 105, 107 which are electrically connected at a connection point 509.

The electrical measurement variable in FIG. 5a and FIG. 5b relates to the charging or discharging current of the first energy accumulator 103, the charging or discharging currents of the further energy accumulators 105, 107 and the common charging or discharging current of the energy accumulator arrangement 101. The arrows in FIG. 5a and FIG. 5b mark the current direction 503 of the charging or discharging current of the first energy accumulator 103, the current directions 505, 507 of the charging or discharging currents of the further energy accumulators 105, 107 and the common current direction 501 of the charging or discharging currents of the energy accumulator arrangement 101.

In FIG. 5a, the common current direction 501 of the energy accumulator arrangement 101, the current direction 503 of the first energy accumulator 103 and the current direction 507 of a further energy accumulator 107 point in the discharging direction. However, the current direction 505 of an additional, further energy accumulator 105 points in the charging direction. This deviation can indicate a defect of the further energy accumulator 105. The defective further energy accumulator 105 in FIG. 5a is not discharged and instead obtains a charging current which is obtained from the first energy accumulator 103 and/or the other further energy accumulator 107. In this arrangement, the defective further energy accumulator 105 can be identified by measuring the polarities of the charging or discharging current of the first energy accumulator 103, the polarities of the charging or discharging currents of the further energy accumulators 105, 107 and the polarity of the common charging or discharging current of the energy accumulator arrangement 101.

In FIG. 5b shows the common current direction 501 of the energy accumulator arrangement 101 and the current direction 503 of the first energy accumulator 103 point in the charging direction. However, the current directions 505, 507 of the further energy accumulators 105, 107 point in the discharging direction. This deviation may indicate a defect of the first energy accumulator 103. The further energy accumulators 105, 107 in FIG. 5b are discharged and provide the first energy accumulator 103 with an additional charging current. This may be caused by a malfunction of the first energy accumulator 103 which, on account of a defect, obtains an additional charging current from the further energy accumulators 105, 107. In this arrangement, the defective first energy accumulator 103 can be identified by measuring the polarities of the charging or discharging current of the first energy accumulator 103, the polarities of the charging or discharging currents of the further energy accumulators 105, 107 and the polarity of the common charging or discharging current of the energy accumulators.

All features explained and shown in connection with individual example of the disclosure may be provided in a different combination in the subject matter according to the disclosure in order to simultaneously achieve their advantageous effects.

LIST OF REFERENCE NUMBERS

100 Measuring arrangement
101 Energy accumulator arrangement
103 First energy accumulator
105 Further energy accumulator
107 Further energy accumulator
109 Circuit arrangement
111 First controllable switch
113 Further controllable switch
115 Further controllable switch
117 Measuring device
119 Processor device
121 Auxiliary energy supply apparatus
123 External charger
200 Parallel circuit
401 First measuring unit
403 Further measuring unit
405 Further measuring unit
407 Common measuring unit
409 Environment measuring unit
411 Communication interface
413 Electrical line arrangement
415 Communication line
417 Electrical resistor
501 Common current direction of the energy accumulator arrangement
503 Current direction of the first energy accumulator
505 Current direction of a further energy accumulator
507 Current direction of a further energy accumulator
509 Connection point

What is claimed is:

1. A measuring arrangement for identifying a malfunction in an energy accumulator arrangement comprising a first energy accumulator and at least one further energy accumulator, comprising:
   a measuring device configured to measure an electrical measurement variable of the first energy accumulator and an electrical measurement variable of the at least one further energy accumulator;
   a circuit arrangement comprising a first controllable switch configured to electrically connect the first energy accumulator to the measuring device and comprising a further controllable switch configured to electrically connect the further energy accumulator to the measuring device; and
   a processor device configured to control the controllable switches of the circuit arrangement, the processor device being configured to keep the first switch closed and to open the further switch in order to disconnect the further energy accumulator from the measuring device to capture the electrical measurement variable of the first energy accumulator and to keep the further switch closed and to open the first switch in order to disconnect the first energy accumulator from the measuring device to capture the electrical measurement variable of the further energy accumulator,
   wherein the measuring device is configured to capture the electrical measurement variable of the first energy accumulator and the electrical measurement variable of the further energy accumulator in temporally successive measurement intervals, wherein only one switch of the circuit arrangement is closed and all other switches of the circuit arrangement are open within a measurement interval.

2. The measuring arrangement of claim 1, the circuit arrangement being configured to connect the first energy accumulator and the further energy accumulator in parallel during operation of the energy accumulators.

3. The measuring arrangement of claim 1, wherein:
the measuring arrangement is operable in a test mode and in an operating mode;
the electrical measurement variable of the first energy accumulator and the electrical measurement variable of the further energy accumulator is captured in the test mode; and
the circuit arrangement in the operating mode is configured to connect the first energy accumulator and the further energy accumulator in parallel.

4. The measuring arrangement of claim 1, wherein:
the measurement interval is a first measurement interval;
the processor device is configured to keep only the first switch closed and to open the further switch within the first measurement interval; and
the processor device is further configured to keep only the further switch closed and to open the first switch within a further measurement interval.

5. The measuring arrangement of claim 1, further comprising:
a first measuring unit connected to the first controllable switch and configured to measure the electrical measurement variable of the first energy accumulator, wherein the electrical measurement variable of the first energy accumulator comprises at least one of an internal resistance, a voltage or a current; and
a further measuring unit connected to the further controllable switch and configured to measure the electrical measurement variable of the further energy accumulator, wherein the electrical measurement variable of the further energy accumulator comprises at least one of an internal resistance, a voltage or a current.

6. The measuring arrangement of claim 1, the processor device being configured to evaluate the measured electrical measurement variables in comparison with electrical reference variables, in order to detect a malfunction of the first energy accumulator or of the further energy accumulator.

7. The measuring arrangement of claim 6, the processor device being configured to permanently open the first controllable switch if a malfunction of the first energy accumulator is detected in order to disconnect the first energy accumulator or to permanently open the further controllable switch if a malfunction of the further energy accumulator is detected in order to disconnect the further energy accumulator.

8. The measuring arrangement of claim 1, wherein the circuit arrangement being configured to connect the first electrical energy accumulator and the further electrical energy accumulator in parallel, and the measuring device being configured to capture a polarity of the electrical measurement variable of the first energy accumulator and a polarity of a further electrical measurement variable in the energy accumulator arrangement, the processor device being configured to identify the malfunction of the energy accumulator arrangement by comparing the polarity of the electrical measurement variable of the first energy accumulator and the polarity of the further electrical measurement variable.

9. The measuring arrangement of claim 8, the processor device being configured to identify the malfunction of an energy accumulator in the energy accumulator arrangement if the polarity of the electrical measurement variable of the first energy accumulator and the polarity of the further electrical measurement variable are different.

10. The measuring arrangement of claim 8, the measuring device being configured to capture the polarity of the electrical measurement variable of the first energy accumulator and the polarity of the further electrical measurement variable by capturing an electrical direction of the electrical measurement variable of the first energy accumulator and of the further electrical measurement variable.

11. The measuring arrangement of claim 8, further comprising:
a first measuring unit configured to capture the polarity of the electrical measurement variable of the first energy accumulator; and
a further measuring unit configured to capture the polarity of the further electrical measurement variable.

12. The measuring arrangement of claim 11, wherein the measuring device comprises a common measuring unit for capturing the polarity of the electrical measurement variable at the connection point of the first energy accumulator and of the further energy accumulator in order to obtain a common polarity, and wherein the processor device is configured to identify the malfunction of the energy accumulator arrangement by comparing the polarity of the electrical measurement variable of the first energy accumulator or the polarity of the further electrical measurement variable with the common polarity.

13. The measuring arrangement of claim 1, the measuring arrangement comprising a connection terminal for connecting the circuit arrangement to an auxiliary energy supply apparatus, in particular an uninterruptible voltage supply, in order to provide the electrical energy accumulators for the auxiliary energy supply.

14. An auxiliary energy supply apparatus for providing electrical energy in a manner independent of a mains, comprising:
an energy accumulator arrangement comprising a first energy accumulator and at least one further energy accumulator; and
a measuring arrangement for identifying a malfunction in the energy accumulator arrangement, the measuring arrangement comprising:
a measuring device configured to measure an electrical measurement variable of the first energy accumulator and an electrical measurement variable of the at least one further energy accumulator;
a circuit arrangement comprising a first controllable switch configured to electrically connect the first energy accumulator to the measuring device and comprising a further controllable switch configured to electrically connect the further energy accumulator to the measuring device;
a processor device configured to control the controllable switches of the circuit arrangement, the processor device being configured to keep the first switch closed and to open the further switch in order to disconnect the further energy accumulator from the measuring device to capture the electrical measurement variable of the first energy accumulator and to keep the further switch closed and to open the first switch in order to disconnect the first energy accumulator from the measuring device to capture the electrical measurement variable of the further energy accumulator,
wherein the measuring device of the measuring arrangement is configured to capture the electrical measurement variable of the first energy accumulator and the electrical measurement variable of the further energy accumulator in temporally successive measurement intervals, wherein only one switch of the circuit arrangement is closed and all other switches of the circuit arrangement are open within a measurement interval.

15. The auxiliary energy supply apparatus of claim 14, the circuit arrangement of the measuring arrangement being configured to connect the first energy accumulator and the further energy accumulator in parallel during operation of the energy accumulators.

16. The auxiliary energy supply apparatus of claim 14, wherein:
   the measuring arrangement is operable in a test mode and in an operating mode;
   the electrical measurement variable of the first energy accumulator and the electrical measurement variable of the further energy accumulator are captured in the test mode; and
   the circuit arrangement in the operating mode is configured to connect the first energy accumulator and the further energy accumulator in parallel.

17. The auxiliary energy supply apparatus of claim 14, wherein:
   the measurement interval is a first measurement interval;
   the processor device is configured to keep only the first switch closed and to open the further switch within the first measurement interval; and
   the processor device is further configured to keep only the further switch closed and to open the first switch within a further measurement interval.

18. The auxiliary energy supply apparatus of claim 14, the measurement device further comprising:
   a first measuring unit connected to the first controllable switch and configured to measure the electrical measurement variable of the first energy accumulator, wherein the electrical measurement variable of the first energy accumulator comprises at least one of an internal resistance, a voltage or a current; and
   a further measuring unit connected to the further controllable switch and configured to measure the electrical measurement variable of the further energy accumulator, wherein the electrical measurement variable of the further energy accumulator comprises at least one of an internal resistance, a voltage or a current.

* * * * *